United States Patent [19]
Beratan et al.

[11] Patent Number: 5,972,108
[45] Date of Patent: Oct. 26, 1999

[54] METHOD OF PREFERENTIALLY-ORDERING A THERMALLY SENSITIVE ELEMENT

[75] Inventors: Howard R. Beratan; Charles M. Hanson, both of Richardson, Tex.

[73] Assignee: Texas Instruments Incorporated, Dallas, Tex.

[21] Appl. No.: 08/910,687

[22] Filed: Aug. 13, 1997

[51] Int. Cl.⁶ .................................................. C30B 9/00
[52] U.S. Cl. ............................... 117/84; 117/92; 117/94; 117/101
[58] Field of Search ................................ 117/84, 92, 94, 117/101

[56] References Cited

U.S. PATENT DOCUMENTS

| | | | |
|---|---|---|---|
| 5,248,564 | 9/1993 | Ramesh | 428/688 |
| 5,270,298 | 12/1993 | Ramesh | 505/1 |
| 5,479,317 | 12/1995 | Ramesh | 361/321.5 |

OTHER PUBLICATIONS

"Ferroelectric Thin Film Research in France," ISIF 91, Proceedings, 3rd International Symposium on Integrated Ferroelectrics, Colorado Springs, CO, Apr. 3–5, 1991, P. Gaucher, S.P.Faure, P. Barboux, Thomson CSF, Laboratoire Central de Recherches, Orsay.

"Producibility advances in hybrid uncooled infrared devices," Proceedings Reprint from Infrared Detectors and Focal Plane Arrays III, SPIE—The International Society for Optical Engineering, Apr. 5–6, 1994, Orlando, FL, Robert Owen, Jeff Belcher, Howard Beratan, Steve Frank.

"Pyroelectric Imaging," Bernard M. Kulwicki and Ahmed Amin, Howard R. Beratan and Charles M. Hanson, IEEE CH3080–0–7803–0465/9/92.

*Primary Examiner*—Benjamin Utech
*Assistant Examiner*—Matt Anderson
*Attorney, Agent, or Firm*—W. James Brady, III; Richard L. Donaldson

[57] ABSTRACT

Method of preferentially-ordering a thermally sensitive element (50) may comprise the step of forming a first thin film layer of electrically conductive material (75). A thin film layer of thermally sensitive material (80) may be formed on a surface of the first layer of electrically conductive material (75). A second thin film layer of electrically conductive material (85) of lanthanum strontium cobalt oxide (LSCO) may be formed on a surface of the layer of thermally sensitive material (80) opposite the first thin film layer (75). A nucleation layer (87) may be formed in communication with the surface of the layer of thermally sensitive material (80) opposite the first thin film layer (75). The layer of thermally sensitive material (80) may be crystallized beginning at the surface of the thermally sensitive layer (80) in communication with nucleation layer (87). The nucleation layer (87) may be removed.

24 Claims, 3 Drawing Sheets

METHOD OF PREFERENTIALLY-ORDERING A THERMALLY SENSITIVE ELEMENT

RELATED APPLICATIONS

This application is related to copending U.S. Patent Application Provisional Ser. No. 60/024,926, Aug. 30,1996 entitled "THIN FILM ELECTRODE AND METHOD;" copending U.S. Patent Application Provisional Ser. No. 60/024,905, filed Aug. 30, 1996 entitled "THERMAL DETECTOR WITH PREFERENTIALLY-ORDERED THERMALLY SENSITIVE ELEMENT AND METHOD;" copending U.S. Patent Application Provisional Ser. No. 60/024,903, filed Aug. 30, 1996 entitled "METAL ORGANIC DECOMPOSITION (MOD) METHOD OF FORMING THERMALLY SENSITIVE ELEMENT;" copending U.S. Patent Application Provisional Ser. No. 60/024,912, filed Aug. 30, 1996 entitled "THERMAL DETECTOR WITH NUCLEATION ELEMENT AND METHOD;" copending U.S. Patent Application Provisional Ser. No. 60/024,907, filed Aug. 30, 1996 entitled "THERMAL DETECTOR WITH INTER-DIGITATED THIN FILM ELECTRODES AND METHOD;" copending U.S. Patent Application Provisional Ser. No. 60/024,906, filed Aug. 30, 1996 entitled "THERMAL DETECTOR WITH STRESS-ALIGNED THERMALLY SENSITIVE ELEMENT AND METHOD."

TECHNICAL FIELD OF THE INVENTION

This invention relates generally to infrared or thermal imaging systems, and more particularly to a method of preferentially-ordering a thermally sensitive element.

BACKGROUND OF THE INVENTION

Thermal imaging systems are often employed to detect fires, overheating machinery, planes, vehicles and people, and to control temperature sensitive industrial processes. Thermal imaging systems generally operate by detecting the differences in thermal radiance of various objects in a scene and by displaying the differences as a visual image of the scene.

The basic components of a thermal imaging system generally include optics for collecting and focusing thermal radiation from a scene, a thermal detector having a plurality of thermal sensors for converting thermal radiation to an electrical signal, and electronics for amplifying and processing the electrical signal into a visual display or for storage in an appropriate medium. A chopper is often included in a thermal imaging system to A.C. couple the detector to the scene. The chopper produces a constant background radiance which provides a reference signal. The electronic processing portion of the thermal imaging system will subtract the reference signal from the total radiance signal to produce a signal with minimum background bias.

The thermal sensors of a thermal imaging system may be disposed in a focal plane array. The focal plane array and its associated thermal sensors are often coupled to an integrated circuit substrate with a corresponding array of contact pads and a thermal isolation structure disposed between the focal plane array and the integrated circuit substrate. The thermal sensors define the respective picture elements or pixels of the resulting thermal image.

One type of thermal sensor includes a thermally sensitive element formed from pyroelectric material which exhibits a state of electrical polarization and/or change in dielectric constant dependent upon temperature changes of the pyroelectric material in response to incident infrared radiation. A pair of thin film electrodes are generally disposed on opposite sides of the pyroelectric material to act as capacitive plates. In this arrangement, the pyroelectric material acts as a dielectric, or insulator, disposed between the capacitive plates. Accordingly, the electrodes are operable to measure the charge generated by the pyroelectric material in response to changes in temperature. As previously discussed, the charge, or electrical signal, may be amplified and processed into a visual display.

The starting place for fabricating a thermal sensor is typically a wafer of silicon or other suitable material. The wafer may have a diameter of about 150 millimeters (6 inches) and an approximate thickness of 660 microns (26 mils). The materials that form the thermal sensors may be deposited on the wafer in layers and removed as necessary.

SUMMARY OF THE INVENTION

A problem with producing thermal sensors having a pyroelectric layer, however, is that the pyroelectric material tends to orient itself during deposition with the elongated, or polar, axis of its crystals parallel to the electrodes. This orientation reduces the pyroelectric properties of the layer, which degrades the electrical signal and thus the visual display of the thermal sensor.

Accordingly, a need has arisen in the art for a method of preferentially-ordering a thermally sensitive element. The present invention provides a method of preferentially-ordering a thermally sensitive element that substantially eliminates or reduces the disadvantages and problems associated with prior thermally sensitive elements.

In accordance with the present invention, a method of preferentially-ordering a thermally sensitive element may comprise the step of forming a first thin film layer of electrically conductive material. A thin film layer of thermally sensitive material may be formed on a surface of the first layer of electrically conductive material. A second thin film layer of electrically conductive material of lanthanum strontium cobalt oxide may be formed on a surface of the thermally sensitive material opposite the first thin film layer. A nucleation layer may be formed in communication with the surface of the thermally sensitive material opposite the first thin film layer. The thin film layer of thermally sensitive material may be crystallized beginning at the surface of the thermally sensitive layer in communication with nucleation layer. The nucleation layer may be removed.

More specifically, in accordance with one embodiment of the present invention, the nucleation layer may be formed on a surface of the second thin film layer opposite the thermally sensitive layer. The thermally sensitive element may comprise a pyroelectric material. The pyroelectric material may be lead lanthanum zirconate titanate (PLZT).

Important technical advantages of the present invention include providing a method of fabricating an improved thermally sensitive element. In particular, a nucleation layer is provided during the fabrication process that preferentially-orders crystals of the second thin film layer of lanthanum strontium cobalt oxide (LSCO). The preferentially-ordered second thin film layer, in turn, preferentially-orders crystals of the thermally sensitive material. This orientation increases the pyroelectric properties of the thermally sensitive element, which improves the electrical signal of the thermal sensor. The improved electrical signal, in turn, improves the visual display obtained from the thermal sensors.

Still another important technical advantage of the present invention includes providing a nucleation layer that does not interfere with operation of the thermal sensors. In particular, the present invention provides a nucleation layer that can be removed during fabrication of the thermal sensors.

Other technical advantages will be readily apparent to one skilled in the art from the following figures, descriptions, and claims.

BRIEF DESCRIPTION OF THE DRAWINGS

For a more complete understanding of the present invention, and the advantages thereof, reference is now made to the following description taken in conjunction with the accompanying drawings, in which.

DETAILED DESCRIPTION OF THE INVENTION

Figures 1, 2:
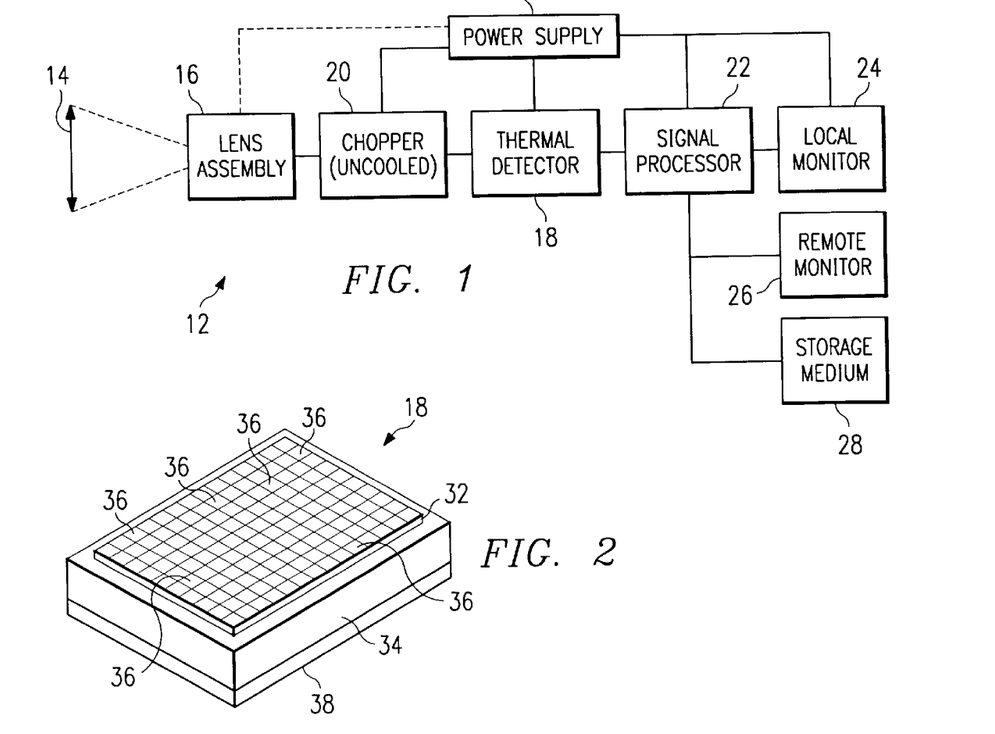
FIG. 1 is a block diagram showing the components of one embodiment of a thermal imaging system constructed in accordance with the present invention.
FIG. 2 is an isometric view of the thermal detector of FIG. 1, showing a focal plane array mounted to an integrated circuit substrate opposite a thermal element.

The preferred embodiments of the present invention and its advantages are best understood by referring now in more detail to FIGS. 1–5 of the drawings, in which like numerals refer to like parts throughout the several views. FIG. 1 shows a schematic block diagram of a thermal imaging system 12 constructed in accordance with the present invention. During operation, the thermal imaging system 12 detects, processes, and displays the heat image of a scene 14.

The thermal imaging system 12 may be especially useful when imaging by means of visual wavelengths is unavailable, such as in the dark or when vision is impaired by smoke, dust, or other particles. In such conditions, the thermal imaging system 12 may detect thermal radiation in the infrared window. The infrared window is a wavelength region in the infrared spectrum where there is good transmission of electromagnetic radiation through the atmosphere. Typically, infrared detectors sense infrared radiation in the spectral bands from 3 to 5 microns (having an energy of 0.4 to 0.25 eV) and from 8 to 14 microns (having an energy of 0.16 to 0.09 eV). The 3–5 micron spectral band is generally termed the "near infrared band" while the 8 to 14 micron spectral band is termed the "far infrared band." Infrared radiation between the near and far infrared bands cannot normally be detected due to atmospheric absorption of the same. The thermal imaging system 12, however, is also useful during the day and when vision by means of the visual wavelengths is available. For example, the thermal imaging system 12 may be used to detect fires, overheating machinery, planes, vehicles and people, and to control temperature sensitive industrial processes.

As shown in FIG. 1, the thermal imaging system 12 may comprise a lens assembly 16 in optical communication with a thermal detector 18. The lens assembly 16 focuses or directs thermal radiation emitted by the scene 14 onto the thermal detector 18. The lens assembly 16 may include one or more lenses made of material that transmits thermal radiation, such as germanium. The design of the lens assembly 16 may be varied depending on the particular use of the thermal imaging system 12. For example, the lens assembly 16 may have a constant or a variable F-number and/or may be a single field of view or a zoom lens.

The thermal detector 18 may be cooled or uncooled. A cooled thermal detector is operated at cryogenic temperatures such as at the temperature of liquid nitrogen, to obtain the desired sensitivity to variation in infrared radiation. In cases where an uncooled detector 18 is used, a chopper 20 is often disposed between the lens assembly 16 and the thermal detector 18. Preferably, the lens assembly 16, thermal detector 18 and chopper 20 are contained within an associated housing (not shown). The thermal detector 18 may also be contained within a vacuum environment or an environment of low thermal conductivity gas.

The chopper 20 may be controlled by a signal processor 22 to periodically interrupt transmission of the thermal image to the thermal detector 18. Various types of mechanical and/or electrical choppers 20 may be satisfactorily used with the present invention. For example, the chopper 20 may be a rotating disk with openings that periodically block and let pass infrared radiation.

The placement of the lens assembly 16 and the chopper 20 with respect to thermal detector 18 is accomplished using well known principles of optical design as applied to thermal imaging systems. As previously described, the lens assembly 16 focuses thermal radiation emitted by the scene 14 onto the thermal detector 18. The thermal detector 18 translates the incoming thermal radiation into corresponding electrical signals for processing.

The electrical signals of the thermal detector 18 may be passed to the signal processor 22, which assembles electrical signals into video signals for display. As previously described, the signal processor 22 may also synchronize operation of the chopper 20. This synchronization enables the signal processor 22 to subtractively process incoming thermal radiation to eliminate fixed background radiation. The output of the signal processor 22 is often a video signal that may be viewed, further processed, stored, or the like.

The video signal of the signal processor 22 may be viewed on a local monitor 24 or fed to a remote monitor 26 for display. The local monitor 24 may be an eye piece containing an electronic viewfinder, a cathode ray tube, or the like. Similarly, the remote monitor 26 may comprise an electronic display, a cathode ray tube, such as a television, or other type of device capable of displaying the video signal. The video signal may also be saved to a storage medium 28 for later recall. The storage medium 28 may be a compact disk, a hard disk drive, random access memory, or any other type of medium capable of storing electronic video signals for later recall. Monitors and storage mediums are well known in the art and therefore will not be further described herein.

Electrical power to operate the thermal imaging system 12 may be provided by a power supply 30. The power supply 30 provides electrical power directly to the chopper 20, the thermal detector 18, the signal processor 22, and to the local monitor 24. Electrical power may also be provided to the lens assembly 16, when, for example, a motor is employed to zoom the lens assembly 16.

FIG. 2 is a detailed view of the thermal detector 18. The thermal detector 18 may comprise a focal plane array 32 mounted to a substrate 34. In one embodiment, the focal plane array 32 may include a number of thermal sensors 36 arranged in a matrix. The quantity and location of the thermal sensors 36 depend upon the N by M configuration desired for the focal plane array 32.

The configuration of the focal plane array 32 generally varies for different types of thermal detectors 18. In a "staring" thermal detector, for example, the entire thermal image is focused onto a large focal plane array. By contrast, a "scanning" thermal detector uses a mirror or similar means to sweep successive portions of the thermal image across a small focal plane array. Usually, although not necessary for the invention, both types of thermal detectors 18 consist of a number of thermal sensors 36, with the output of each thermal sensor 36 representing a portion of the viewed scene 14. For example, the output of each thermal sensor 36 in focal plane array 32 may represent a single pixel of the total image. This embodiment may be particularly beneficial for use in connection with high density visual displays.

The substrate 34 may be an integrated circuit substrate that provides the necessary electrical couplings and circuitry to process the thermal image formed on the focal plane array 32. The integrated circuit substrate 34 may be formed of silicon, ceramic alumina, or other suitable materials which are both chemically and thermally compatible with the multiple layers which will be formed on the surface 66 (FIG. 4) of the integrated surface substrate 34. Further information regarding thermal sensors mounted on an underlying integrated circuit substrate is disclosed by U.S. Pat. No. 4,143,269 issued to McCormack, et al., entitled "Ferroelectric Imaging System" and U.S. Pat. No. 5,021,663 issued to Hornbeck, entitled "Infrared Detector."

A thermal element 38 may be provided to maintain the integrated circuit substrate 34 at a constant predefined temperature. The constant temperature prevents ambient or internally generated temperature gradients from affecting the thermal sensors 36 and thus provides a baseline with which the thermal energy of the scene 14 can be accurately measured. The necessary electrical couplings and circuitry to control the thermal element 38 may be provided by the integrated circuit substrate 34. In such a case, the thermal element 38 may be coupled to the integrated circuit substrate 34 opposite the focal plane array 32.

Figure 3:
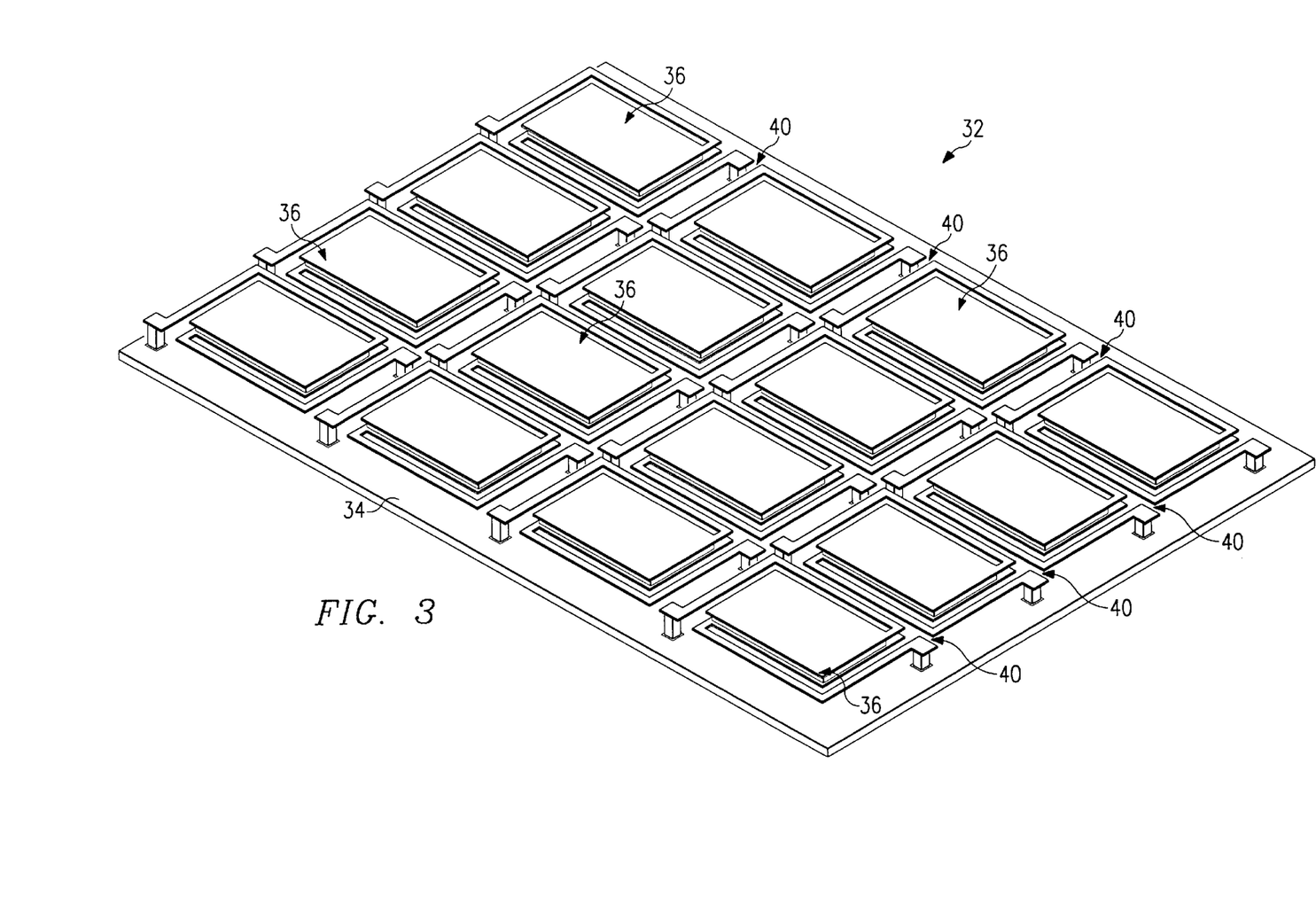
FIG. 3 is a detailed isometric view of the focal plane array of FIG. 2, showing a matrix of thermal sensors.

FIG. 3 illustrates a detailed view of the previously described focal plane array 32. In this embodiment, the focal plane array 32 includes a matrix of thermal sensors 36. Each thermal sensor 36 forms a discrete element of the focal plane array 32. The thermal sensors 36 may be separated by a set of intersecting slots 40 provided around the perimeter of each thermal sensor 36. The slots 40 provide a high degree of reticulation between adjacent thermal sensors 36 that substantially reduces thermal spreading between the pixel elements.

The thermal sensors 36 may detect thermal radiation using various techniques. For example, the thermal sensors may be based upon the generation of a charge due to a change in temperature resulting from thermal radiation heating the thermal sensors 36. Alternatively, the thermal sensors 36 may be based upon the generation of a charge due to a photon-electron interaction within the material used to form the thermal sensors 36. This latter effect is sometimes called the internal photoelectric effect. The thermal sensors 36 may also be based upon the change in resistance of a thin conductor caused by the heating effect of thermal radiation. Such thermal sensors 36 are sometimes referred to as bolometers. It will be understood that these and other types of thermal sensors 36 may be used in accordance with the present invention.

Figure 4:
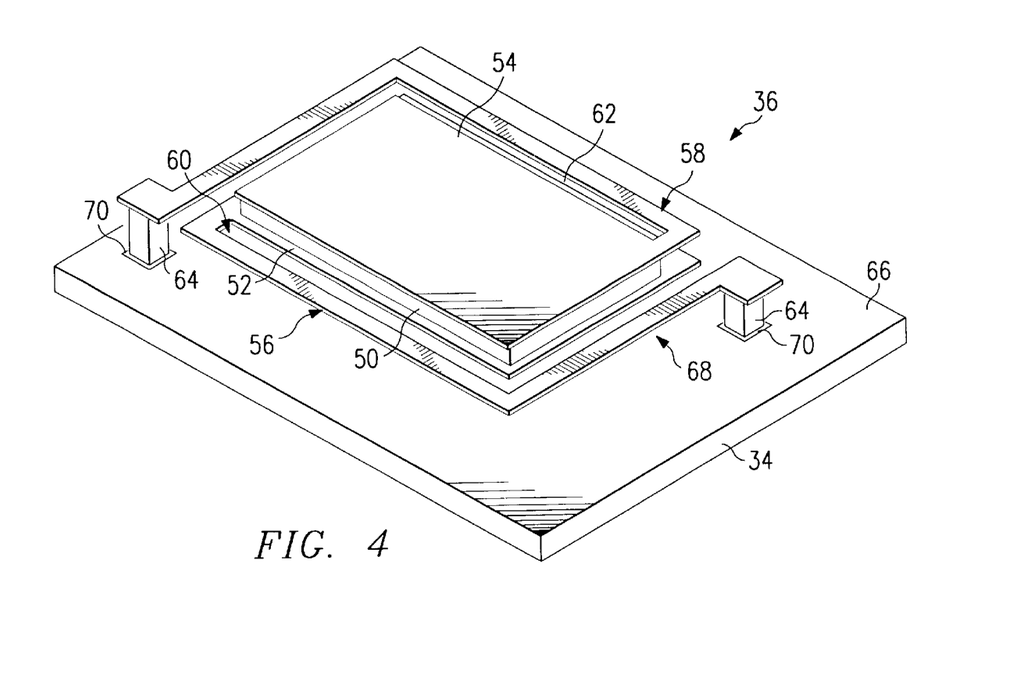
FIG. 4 is a detailed isometric view of one of the thermal sensors of FIG. 3, showing a thermally sensitive element disposed between a pair of thin film electrodes.

FIG. 4 illustrates a detailed view of one of the thermal sensors 36. Each thermal sensor 36 may include a thermally sensitive element 50 disposed between a first electrically conductive element 52 and a second electrically conductive element 54. In one embodiment, the thermally sensitive element 50 is preferably formed from pyroelectric materials. The pyroelectric materials may also be ferroelectric materials such as barium strontium titanate (BST), barium titanate (IT), and antimony sulfoiodide (SbSI), or any lead containing ferroelectric material including lead titanate (PT), lead lanthanum titanate (PLT), lead zirconate titanate (PZT), lead lanthanum zirconate titanate (PLZT), lead zinc niobate (PZN), lead strontium titanate (PSrT), and lead scandium tantalate (PST). In this embodiment, the thermally sensitive element 50 generates a charge in response to a change in temperature. It will be understood, however, that the present invention contemplates forming the thermally sensitive element 50 from any thermal sensitive material that provides a satisfactory response to thermal radiation.

The thickness of the thermally sensitive element 50 may vary depending upon the wavelength of thermal radiation that the thermal imaging system 12 is designed to detect.

The thermally sensitive element 50 is preferably a thin film to enhance responsiveness to thermal radiation and transmission of a generated charge to the electrically conductive elements 52 and 54.

A significant feature of the present invention is the crystallographic orientation of the thermally sensitive element 50. The thermally sensitive element 50 may comprise a plurality of preferentially-ordered crystals. Preferentially-ordered crystals are crystals arranged out of their natural orientation. Pyroelectric materials tend to have a natural orientation with the elongated, or polar, axis parallel to the electrodes. The preferentially-ordered crystals may be oriented within 45 degrees of normal to the electrodes. Preferably, the polar axis of the crystals is normal to the electrically conductive elements 52 and 54. This orientation increases pyroelectric properties of the thermally sensitive element 50 relative to the electrically conductive elements 52 and 54, which improves the electrical signal of the thermal sensor 36. The improved thermal sensor 36 improves the visual display obtained from the thermal detector 18.

As described in more detail below, crystals of the thermally sensitive element may be preferentially-ordered by a nucleation layer formed during the fabrication process. The nucleation layer may communicate a crystallographic orientation to the thermally sensitive element 50 through a layer of lanthanum strontium cobalt oxide (LSCO). The second electrically conductive element 54 may form the layer of lanthanum strontium cobalt oxide (LSCO). The nucleation layer crystallizes before the second electrically conductive element 54 and thermally sensitive element 50 to provide a template from which crystals of the elements may grow. In another embodiment, the nucleation layer may comprise lanthanum strontium cobalt oxide (LSCO).

The nucleation layer may be formed on the second electrically conductive element 54. A barrier layer may be formed between the nucleation layer and the second electrically conductive element 54. A barrier layer may be desired, when, for example, the material of the nucleation layer is not compatible with the second electrically conductive element 54. In such a case, the nucleation layer may communicate a crystal orientation to the second electrically conductive element 54 through the barrier layer.

The nucleation layer may be removed after the thermally sensitive material is preferentially-ordered. Accordingly, the nucleation layer does not interfere with operation of the thermal sensors 36. The nucleation layer may be removed by chemical etching, dry etch, chemi-mechanical polishing, or the like.

The first electrically conductive element 52 and the second electrically conductive element 54 may be disposed on opposite sides of the thermally sensitive, or pyroelectric, element 50. In this arrangement, the electrically conductive elements 52 and 54 function as electrodes that receive charges generated by the pyroelectric element 50 in response to thermal radiation. Accordingly, the electrodes 52 and 54 are in electrical communication with the pyroelectric element 50, which includes capacitive coupling.

The electrically conductive elements, or electrodes, 52 and 54 may be thin film electrodes. Thin film electrodes 52 and 54 are generally preferred because they may be virtually transparent to thermal radiation. Thin film electrodes are also preferred because they do not rob absorbed thermal energy from the pyroelectric element 50.

The electrode 52 may be constructed of lanthanum strontium cobalt oxide (LSCO), a solid solution of platinum and rhodium as described in related U.S. patent application Provisional Ser. No. 60/024,926, entitled "THIN FILM ELECTRODE AND METHOD." Alternately, the electrode 52 may be formed of various single component materials that are electrically conductive. For example, the electrode 52 may be formed of palladium or platinum, or from conductive oxides such as ruthenium oxide ($RuO_2$). The electrode 54 is preferably constructed of lanthanum strontium cobalt oxide (LSCO).

The thermal sensor 36 is preferably self-supported above the integrated circuit substrate 34. As shown by FIG. 4, a first support arm 56 preferably extends from the first electrode 52. A second support arm 58 preferably extends from the second electrode 54. In another embodiment, the thermally sensitive element 50 may be divided into separate sections and the support arms 56 and 58 may extend from a bifurcated electrode 52 or 54.

For many applications, the support arm 56 is preferably formed from the same type of material as the first electrode 52. Similarly, the support arm 58 is preferably formed from the same type of material as the second electrode 54. The support arms 56 and 58 however may be formed of a different material than the electrodes 52 and 54. Additionally, the thickness of the support arms 56 and 58 may be varied to control thermal conductance between the electrodes and the integrated circuit substrate 34. Thermally sensitive material may be disposed above the support arm 56 and below the support arm 58.

The length, width and thickness of the support arms 56 and 58 may be selected to enhance their resistance to the transfer of thermal energy between the thermal sensor 36 and the integrated circuit substrate 34. In one embodiment, for example, slots 60 and 62 may be formed between each support arm and its respective electrode to bifurcate the support arms and thus provide additional thermal isolation between the support arms and their associated electrodes. In this embodiment, the thermal isolation of each support arm may be increased by lengthening the bifurcated support arm. Thermal isolation may be maximized by fully extending each support arm along opposite halves of the perimeter of the electrodes.

A pair of posts 64 may be provided to support the bifurcated support arms 56 and 58, and thus the thermal sensor 36, in spaced relation with a surface 66 of the integrated circuit substrate 34. The posts 64 may each support one of the bifurcated support arms. The posts 64 are preferably formed from material which is electrically conductive. In this embodiment, each post 64 may transmit electrical signals from its respective electrode to a contact pad 70 of the integrated circuit substrate 34. Thus, the posts 64 provide both mechanical support and a signal flow path to the associated contact pad 70.

A chamber 68 may be formed by the gap between the bottom of the first electrode 52 and the surface 66 of the integrated circuit substrate 34. The pyroelectric element 50 may absorb thermal radiation directly or in part after the radiation has passed through the chamber 68 and reflected off the integrated circuit substrate 34. For an embodiment in which thermal radiation is absorbed in part after reflecting off the integrated circuit substrate 34, the dimensions of the chamber 68 may be varied depending upon the wavelength of the thermal radiation that the thermal imaging system 12 is designed to detect. The chamber 68 preferably corresponds to about one-fourth of the selected thermal radiation wavelength. Thus, if thermal imaging system 12 is designed to detect thermal radiation having a wavelength of 7.5 to 14 microns, the chamber 68 preferably has a height of approximately two to three microns. In this embodiment, the electrodes 52 and 54 may be transparent to thermal radiation. The ability to vary the position of bottom of the first electrode 52 with respect to the surface 68 of the integrated substrate 34 enhances the responsiveness of thermal sensor 36 to thermal radiation.

Figure 5A:
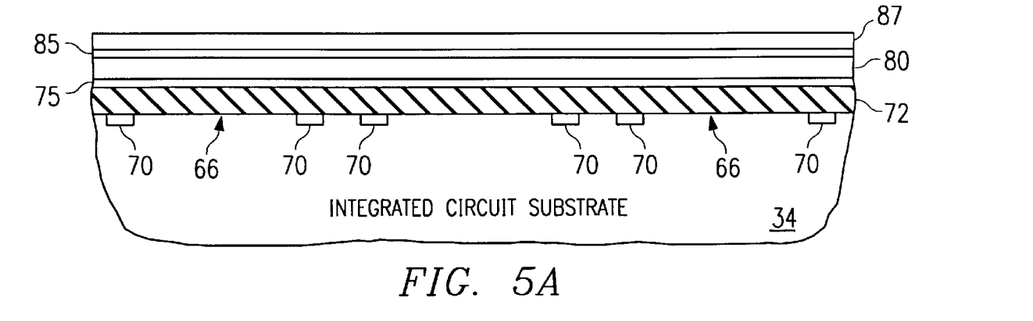
FIGS. 5A, 5B, 5C, and 5D are a series of elevation views in section showing various stages of fabrication of the thermal sensor of FIG. 4 in accordance with one embodiment of the present invention.

FIGS. 5A–D depict various steps during the process of fabricating the thermal sensors 36 in accordance with an embodiment of the present invention. As shown in FIG. 5A, an array of contact pads 70 may be disposed on the surface 66 of the integrated circuit substrate 34 to receive electrical signals generated by the thermal sensors 36. As previously described, the integrated circuit substrate 34 may be formed from silicon or other suitable materials which are both chemically and thermally compatible with the multiple layers which will be formed on the surface 66 of the integrated surface substrate 34.

A sacrificial layer 72 may be deposited on the iintegrated circuit substrate 34. During the fabrication process, the sacrificial layer 72 forms a base upon which the thermal sensors 36 may be formed in space relation with the integrated circuit substrate 34. Accordingly, the sacrificial layer 72 may be removed after processing to yield the chamber 68.

The sacrificial layer should have a thickness equal to the desired height of the chamber 68. As previously described, the height of the chamber preferably corresponds to one-fourth of the selected thermal radiation wavelength. Thus, if thermal sensors 36 are to detect thermal radiation having a wavelength of 7.5 to 14 microns, the sacrificial layer should be deposited in a thickness of approximately two to three microns. The sacrificial layer 72 is preferably silicon dioxide ($SiO_2$) or polyimide or a similar type of material compatible with fabrication of the thermal sensors 36. A material is compatible with the fabrication of the thermal sensors 36 when it will not inordinately shrink or expand or burn, melt or interact with other materials to an extent that it interferes with processing. The material of the sacrificial layer 72 is also preferably removable by way of dry etching techniques.

A first layer of electrically conductive material 75 may next be formed on the sacrificial layer 72. As described below, the first layer of electrically conductive material 75 will form the first electrode 52. The first layer of electrically conductive material 75 may be formed of various types of materials such as palladium, platinum or lanthanum strontium cobalt oxide (LSCO). However, the present invention allows other types of electrically conductive material to be used depending on the type of thermal sensors 36 which will be formed on the integrated circuit substrate 34. For example, as previously described, the first layer of electrically conductive material 75 may be constructed of a solid solution.

A layer of thermally sensitive material 80 may next be formed on the first layer of electrically conductive material 75. Preferably, the layer of thermally sensitive material 80 is formed in an amorphous state. As described below, the amorphous thermally sensitive layer 80 may be crystallized in alignment with a nucleation layer. The layer of thermally sensitive material 80 will form the thermally sensitive element 50.

In one embodiment, the layer of thermally sensitive material 80 is preferably formed from pyroelectric material such as barium strontium titanate (BST), barium titanate (BT), and antimony sulfoiodide (SbSI). In other embodiments, lead containing ferroelectric materials including lead titanate (PT), lead lanthanum titanate (PLT), lead zirconate titanate (PZT), lead lanthanum zirconate titanate (PLZT), lead zinc niobate (PZN), lead strontium titanate (PSrT), and lead scandium tantalate (PST) may be used to form the thermally sensitive layer 80. The selection of material for the thermally sensitive layer 80 depends upon the type of thermal sensor 36 which will be formed on the integrated circuit substrate 34.

A second layer of electrically conductive material 85 may be formed on the thermally sensitive layer 80 opposite from the first layer of electrically conductive material 75. Preferably, the second layer of electrically conductive material 85 is formed in an amorphous state. As described below, the amorphous layer 85 may be crystallized in alignment with a nucleation layer. The second layer of electrically conductive material 85 will form the second electrode 54.

The second layer of electrically conductive material 85 is preferably formed of lanthanum strontium cobalt oxide (LSCO). As described below, the lanthanum strontium cobalt oxide (LSCO) layer may communicate a crystallographic orientation of a nucleation layer to the thermally sensitive layer 80. Lanthanum strontium cobalt oxide (LSCO) is compatible with most pyroelectric materials, including lead lanthanum zirconate titanate (PLZT).

In accordance with the present invention, a nucleation layer 87 may be formed on the second layer of electrically conductive material 85 opposite from the thermally sensitive layer 80. In another embodiment, the nucleation layer may be formed on the thermally sensitive layer 80. The nucleation layer 87 provides a template with which the crystallographic orientation of the thermally sensitive layer 80 may be preferentially-ordered. Preferably, the nucleation layer 87 orders the polar axis of the crystals normal to the electrodes 52 and 54. If not normal to the electrodes 52 and 54, the polar axis of the crystals may be at an angle greater than ninety degrees. The normal orientation increases the pyroelectric coefficient of the layer relative to the electrodes 52 and 54 and thus maximizes performance. Additionally, the dielectric constant may be minimized for tetragonal perovskite materials.

The nucleation layer 87 should be crystallized before the second electrically conductive layer 85 and the thermally sensitive layer 80 to provide a template for preferentially-ordering those layers. The nucleation layer 87, second electrically conductive layer 85 and thermally sensitive layer 80 may be crystallized in that order by heating the nucleation layer 87 directly and the second electrically conductive layer 85 and the thermally sensitive layer 80 through the nucleation layer 87. In one embodiment, the nucleation layer 87 may be heated directly by a radiant energy source provided above the nucleation layer 87 opposite the second electrically conductive layer 85 and thermally sensitive layer 80.

In this embodiment, the radiant energy creates a thermal gradient from the nucleation layer 87 toward the integrated circuit substrate 34. The thermal gradient extends through the second electrically conductive layer 85 and the thermally sensitive layer 80. Accordingly, the nucleation layer 87 crystallizes first to form a template from which crystals of the second electrically conductive layer 85 may grow. After the second electrically conductive layer 85 has crystallized, it provides a template from which crystals of the thermally sensitive layer 80 may grow. Crystals of the thermally sensitive layer 80 will form beginning at the second electrically conductive layer 85. Crystal formation proceeds from the nucleation layer 87 toward the first layer of electrically conductive material 75. Thus, crystals of the thermally sensitive layer 80 will grow homogeneously from the second electrically conductive layer 85 down to the first layer of electrically conductive material 75. Accordingly, crystals of the thermally sensitive layer 80 will be preferentially-ordered in accordance with the crystallographic orientation of the nucleation layer 82.

The thermal gradient may be facilitated by heat sinking the integrated circuit substrate 34. A heat sink may also be used to protect the integrated circuit substrate 34 from the heat associated with crystallizing the nucleation layer 82 and the thermally sensitive layer 80.

The nucleation layer 87 may be formed of various types of material. Preferably, the nucleation layer 87 comprises anisotropic material in that it has a strong driving force toward a particular orientation. Thus, the nucleation layer 82 provides a strong growth axis for the thermally sensitive layer 80. The nucleation material may be bismuth titanate ($Bi_4Ti_3O_{12}$), lanthanum strontium cobalt oxide (LSCO) or similar materials.

A barrier layer may be formed between the nucleation layer 87 and the second electrically conductive layer 85 or between the second electrically conductive layer 85 and the thermally sensitive material. A barrier layer may be desired, when, for example, the material of the nucleation layer is not compatible with the thermally sensitive material. In such a case, the nucleation layer may communicate a crystal orientation to the thermally sensitive material through the barrier layer.

Figure 5B:
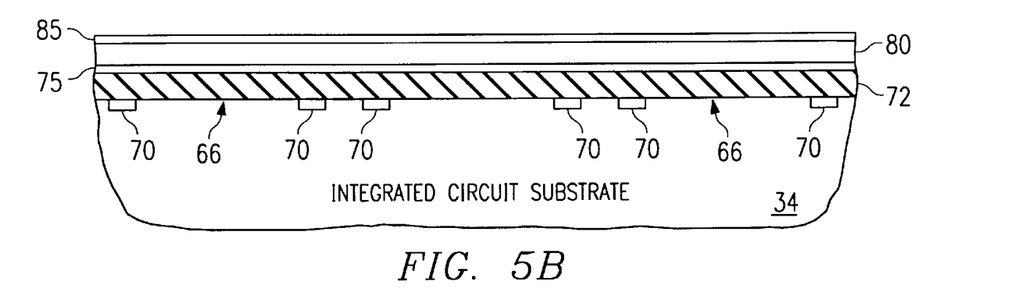

As shown by FIG. 5B, the nucleation layer 87 and any barrier layer may be removed after the thermally sensitive material is preferentially-ordered. Accordingly, the nucleation layer 87 does not interfere with operation of the thermal sensors. The nucleation layer 87 may be removed by chemical etching, dry etch, chemi-mechanical polishing, or the like.

Various techniques may be used to form thin film layers 72, 75, 80, 85 and 87. Often these techniques are divided into two groups—film growth by interaction of a vapor deposited species with an associated substrate and film formation by deposition without causing changes to the associated substrate. The first group of thin film growth techniques includes thermal oxidation and nitridation of single crystal silicon and polysilicon. The formation of silicides by direct reaction of a deposited metal and the substrate is also frequently included in this first group of thin film growth techniques.

The second group of thin film growth techniques may be further divided into three subclasses of deposition. The first subclass is often referred to as chemical vapor deposition (CVD) in which solid films are formed on a substrate by the chemical reaction of vapor phase chemicals which contain the desired constituents for the associated thin film layer. The second subclass is often referred to as physical vapor deposition (PVD) in which the desired thin film layer is physically dislodged from a source to form a vapor and transport it across a reduced pressure region to the substrate. The dislodged layer is then condensed to form the desired thin film layer. The third subclass typically involves coating the substrate with a liquid which is then dried to form the desired thin film layer. The formation of thin film layers by PVD includes such processes as sputtering, evaporation and molecular beam epitaxy. Spin coating is one of the most commonly used techniques for depositing liquids on a substrate to form a thin film layer.

Thin film layers may also be satisfactorily grown in accordance with the teachings of the present invention by using techniques such as dipping, vapor phase deposition by sputtering or MOCVD, and sol/gel or metal organic decomposition (MOD) by spin coating. Processes should be selected to establish the desired electrical and thermal characteristics for the resulting thermal sensors 36. Additionally, depending upon the type of materials used to form layers 72, 75, 80, 85 and 87, one or more buffer layers or protective layers (not shown) may be disposed between surface 66 of integrated circuit substrate 34 and/or layers 72, 85, 80, 85 and 87.

The various techniques may be integrated to allow fabrication of the thermal sensors 36 on integrated circuit substrate 34 using processes associated with the manufacture of very large scale integrated circuits. Material usage and overall process efficiency associated with fabricating a focal plane array 32 may be substantially improved. For example, thermally sensitive layer 80 is preferably formed with approximately the same thickness as desired for thermal sensitive elements 50. Thus, the possibility of polishing damage associated with previous techniques used to form thermal sensitive elements from pyroelectric materials have been substantially reduced or eliminated.

Figure 5C:
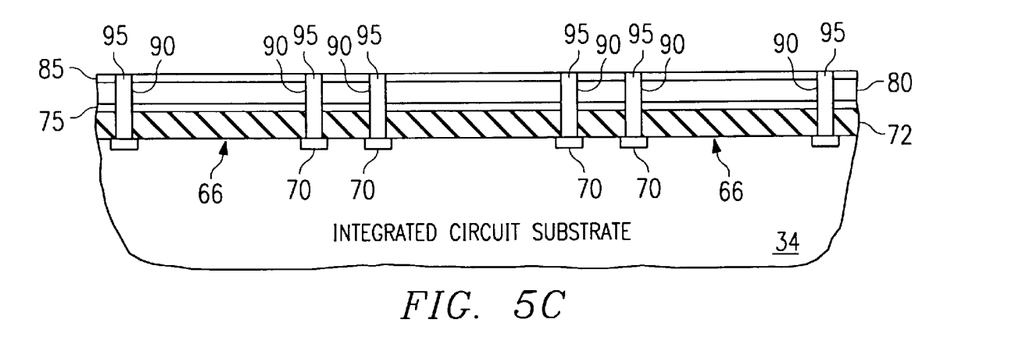

As shown by FIG. 5C, a pair of vias 90 may be formed for each thermal sensor 36. The vias 90 are preferably formed using anisotropic etching or other photolithographic techniques. The post 64 may be formed by filling the vias 90 with a supporting material. For one application, the supporting material 95 may be platinum. However, other types of material may be used for the post 64 depending on the type of thermal sensors 36 that are to be fabricated, as well as the temperatures and processes involved in fabrication.

Figure 5D:
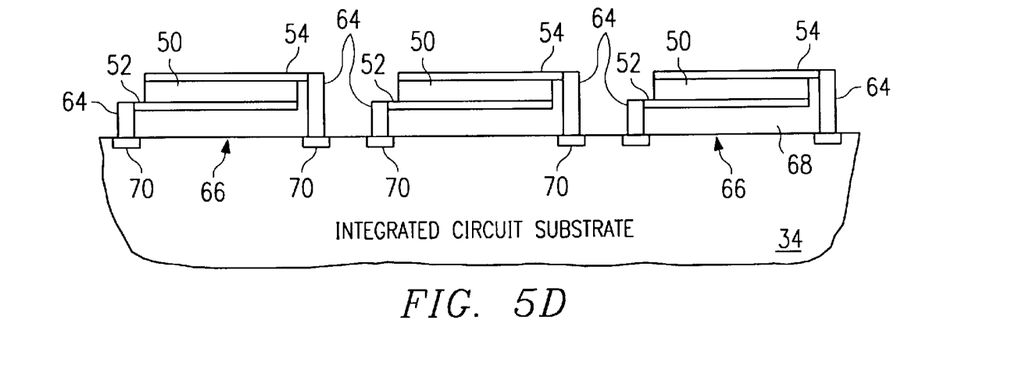

As shown by FIG. 5D, after forming the desired layers of material 72, 75, 80 and 85 on the surface 66 of the integrated circuit substrate 34 and the posts 64 in the layers, individual thermal sensors 36 may be defined on the integrated circuit substrate 34. As previously discussed, the sacrificial layer 72 is removed during processing to form the cavity 68. The nucleation layer 87 may also be removed. Various photolithographic techniques including anisotropic etching processes may be used to define the desired thermal sensors 36. Depending upon the type of materials used to form layers 75, 80 and 85, the anisotropic etching processes may include oxygen-based ion milling, reactive ion etch (RIE) or a magnetically enhanced reactive ion etch (MERIE).

In the resulting thermal sensors 36 the first electrode 52 is preferably formed from the first layer of electrically conductive material 75. The thermally sensitive element 50 is preferably formed from the thermally sensitive layer 80. The second electrode 54 is preferably formed from the second layer of electrically conductive material 85. The posts 64 are formed from the supporting material 95 in the vias 90. In one embodiment, the post 64 for the bottom electrode 52 may extend past the bottom electrode to the height of the post 64 of the top electrode. The posts 64 rest on the contact pads 70.

Additionally, the thermal sensors 36 preferably include the cavity 68 between the first electrode 52 and the surface 66 of integrated circuit substrate 34. As previously discussed, the cavity 68 will preferably have a height which corresponds to about one quarter of the wavelength of the incident infrared radiation which will be detected by thermal sensors 36. For one application, post 64 and the associated cavity 68 have a height of approximately two and one-half microns.

The sole table below provides an overview of some embodiments in the drawings.

| Drawing Element | Preferred or Specific Term | Generic Term | Alternate Terms |
|---|---|---|---|
| 16 | Lens Assembly | Optics | |
| 20 | Chopper | Device that interrupts beam of radiation | |
| 22 | Signal Processor | Electronics | |
| 24 | Monitor | Display | Electronic viewfinder, Cathbde ray tube |
| 32 | Focal plane array | Matrix of thermal sensors | |
| 34 | Integrated circuit substrate | Silicon switching matrix | |
| 36 | Pyroelectric sensors | Thermal sensors | Bolometers |
| 50 | Pyroelectric element | Thermally sensitive element | Barium strontium titanate (BST), barium titanate (BT), and antimony sulfoiodide (SbSI), or any lead containing ferroelectric material including lead titanate (PT), lead lanthanum titanate (PLT), lead zirconate titanate (PZT), lead lanthanum zirconate titanate (PLZT), lanthanum strontium cobalt oxide (LSCO), lead zinc niobate (PZN), lead strontium titanate (PSrT), and lead scandium tantalate (PST). |
| 52 | First thin film electrode | First electrically conductive element | Solid solution, platinum or palladium |
| 54 | Second thin film electrode | Second electrically conductive element | Lanthanum strontium cobalt oxide (LSCO), solid solution, platinum or palladium |
| 64 | Post | Mechanical support | |
| 87 | Nucleation layer | Template | Anisotropic material |

Although the present invention has been described with several embodiments, various changes and modifications may be suggested to one skilled in the art. Thus, it is intended that the present invention encompass such changes and modifications as fall within the scope of the appended claims.

What is claimed is:

1. A method of preferentially-ordering a thermally sensitive element comprising the steps of:

forming a first thin film layer of electrically conductive material;

forming a thin film layer of thermally sensitive material on a surface of the first layer of electrically conductive material;

forming a second thin film layer of electrically conductive material of lanthanum strontium cobalt oxide (LSCO) on a surface of the thin film layer of thermally sensitive material opposite the first thin film layer; and forming a nucleation layer in communication with the surface of the film layer of thermally sensitive material opposite the first thin film layer;

crystallizing the thin film layer of thermally sensitive material beginning at the surface in communication with nucleation layer; and removing the nucleation layer.

2. The method of claim 1, wherein the nucleation layer is formed on a surface of the second thin film layer opposite the thermally sensitive layer.

3. The method of claim 1, wherein the step of crystallizing the thin film layer of thermally sensitive material beginning at the nucleation layer comprises the step of heating the nucleation layer to preferentially-order crystals of the second thin film layer of lanthanum strontium cobalt oxide (LSCO), the preferentially-ordered second thin film layer preferentially-ordering crystals of the thermally sensitive material.

4. The method of claim 3, wherein the preferentially-ordered crystals each include a polar axis normal to the electrically conductive layers.

5. A method for fabricating a thermal detector having a focal plane array of thermal sensors mounted to an integrated circuit substrate comprising the steps of:

forming a sacrificial layer of material on a surface of the integrated circuit substrate;

forming a first thin film layer of electrically conductive material on a surface of the sacrificial layer opposite the integrated circuit substrate;

forming a thin film layer of thermally sensitive material on a surface of the first layer of electrically conductive material opposite the sacrificial layer;

forming a second thin film layer of electrically conductive material of lanthanum strontium cobalt oxide (LSCO) on a surface of the thin film layer of thermally sensitive material opposite the first thin film layer; and forming a nucleation layer in communication with the surface of the film layer of thermally sensitive material opposite the first thin film layer;

crystallizing the thin film layer of thermally sensitive material beginning at the surface in communication with nucleation layer;

removing the nucleation layer; and forming from the thin film layers of material a number of thermal sensors which form the focal plane array mounted to the integrated circuit substrate.

6. The method of claim 5, further comprising the step of removing the sacrificial layer to form a cavity between the integrated circuit substrate and each thermal sensor.

7. The method of claim 5, wherein the nucleation layer is formed on a surface of the second thin film layer opposite the thermally sensitive layer.

8. The method of claim 5, wherein the step of crystallizing the thin film layer of thermally sensitive material beginning at the nucleation layer comprises the step of heating the nucleation layer to preferentially-order crystals of the second thin film layer of lanthanum strontium cobalt oxide (LSCO), the preferentially-ordered second thin film layer preferentially-ordering crystals of the thermally sensitive material.

9. The method of claim 8, wherein the preferentially-ordered crystals each include a polar axis normal to the electrically conductive layers.

10. The method of claim 8, wherein the nucleation layer is heated with radiant energy.

11. The method of claim 8, further comprising the step of providing a heat sink for the substrate during the step of heating the nucleation layer.

12. The method of claim 5, wherein the thermally sensitive material is a pyroelectric material.

13. The method of claim 5, wherein the thermally sensitive material is lead lanthanum zirconate titanate (PLZT).

14. The method of claim 5, wherein the sacrificial layer is removed prior to crystallizing the thin film layer of thermally sensitive material.

15. A method for fabricating a thermal detector having a focal plane array of thermal sensors mounted to an integrated circuit substrate comprising the steps of:

forming a sacrificial layer of material on a surface of the integrated circuit substrate;

forming a first thin film layer of electrically conductive material on a surface of the sacrificial layer opposite the integrated circuit substrate;

forming a thin film layer of thermally sensitive material on a surface of the first layer of electrically conductive material opposite the sacrificial layer;

forming a second thin film layer of electrically conductive material of lanthanum strontium cobalt oxide (LSCO) on a surface of the thin film layer of thermally sensitive material opposite the first thin film layer; and forming a nucleation layer in communication with the surface of the film layer of thermally sensitive material opposite the first thin film layer;

crystallizing the thin film layer of thermally sensitive material beginning at the surface in communication with nucleation layer; and forming from the thin film layers of material a number of thermal sensors which form the focal plane array mounted to the integrated circuit substrate.

16. The method of claim 15, further comprising the step of removing the sacrificial layer to form a cavity between the integrated circuit substrate and each thermal sensor.

17. The method of claim 15, wherein the nucleation layer is formed on a surface of the second thin film layer opposite the thermally sensitive layer.

18. The method of claim 15, wherein the step of crystallizing the thin film layer of thermally sensitive material beginning at the nucleation layer comprises the step of heating the nucleation layer to preferentially-order crystals of the second thin film layer of lanthanum strontium cobalt oxide (LSCO), the preferentially-ordered second thin film layer preferentially-ordering crystals of the thermally sensitive material.

19. The method of claim 18, wherein the preferentially-ordered crystals each include a polar axis normal to the electrically conductive layers.

20. The method of claim 18, wherein the nucleation layer is heated with radiant energy.

21. The method of claim 18, further comprising the step of providing a heat sink for the substrate during the step of heating the nucleation layer.

22. The method of claim 15, wherein the thermally sensitive material is a pyroelectric material.

23. The method of claim 15, wherein the thermally sensitive material is lead lanthanum zirconate titanate (PLZT).

24. A method of preferentially-ordering a thermally sensitive element comprising the steps of:

forming a first thin film layer of electrically conductive material;

forming a thin film layer of thermally sensitive material on a surface of the first layer of electrically conductive material;

forming a nucleation layer of lanthanum strontium cobalt oxide (LSCO) in communication with the surface of the film layer of thermally sensitive material opposite the first thin film layer;

forming a second thin film layer of electrically conductive material on a surface of the thin film layer of thermally sensitive material opposite the first thin film layer;

crystallizing the thin film layer of thermally sensitive material beginning at the surface in communication with nucleation layer; and removing the nucleation layer.

* * * * *